United States Patent
Kato et al.

(10) Patent No.: US 8,388,724 B2
(45) Date of Patent: Mar. 5, 2013

(54) SOLDER PASTE

(75) Inventors: Rikiya Kato, Soka (JP); Sakie Yamagata, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 982 days.

(21) Appl. No.: 12/226,653

(22) PCT Filed: Apr. 23, 2007

(86) PCT No.: PCT/JP2007/058728
§ 371 (c)(1), (2), (4) Date: Feb. 9, 2009

(87) PCT Pub. No.: WO2007/125861
PCT Pub. Date: Nov. 8, 2007

(65) Prior Publication Data
US 2009/0220812 A1    Sep. 3, 2009

(30) Foreign Application Priority Data
Apr. 26, 2006   (JP) .................................. 2006-121684

(51) Int. Cl.
| B32B 15/01 | (2006.01) |
| B32B 15/02 | (2006.01) |
| B32B 15/20 | (2006.01) |
| B23K 1/00  | (2006.01) |

(52) U.S. Cl. ........... 75/255; 428/402; 428/570; 228/193
(58) Field of Classification Search ........................ None
See application file for complete search history.

(56) References Cited

U.S. PATENT DOCUMENTS

| 4,740,252 A * | 4/1988 | Hasegawa et al. | 148/24 |
| 5,328,522 A * | 7/1994 | Sowa et al. | 148/23 |
| 5,431,745 A * | 7/1995 | Koschlig et al. | 148/24 |
| 5,928,404 A * | 7/1999 | Paruchuri et al. | 75/255 |
| 2003/0224197 A1 * | 12/2003 | Soga et al. | 428/570 |
| 2006/0061974 A1 | 3/2006 | Soga et al. | 361/743 |

FOREIGN PATENT DOCUMENTS

| JP | 08141780 | 6/1996 |
| JP | 2000024791 | 1/2000 |
| JP | 2000176678 | 6/2000 |
| JP | 2002254194 | 9/2002 |
| JP | 2002261105 | 9/2002 |
| JP | 2003260587 | 9/2003 |

* cited by examiner

Primary Examiner — Jennifer McNeil
Assistant Examiner — Adam Krupicka
(74) Attorney, Agent, or Firm — Michael Tobias

(57) ABSTRACT

High-temperature solders having a higher melting point than solder alloys used for soldering of printed circuit boards are used for internal bonding of electronic parts, but high-temperature solders which are free from Pb have not been developed. There exist high-temperature solders which comprises Sn balls and Cu balls and which perform bonding through the formation of an intermetallic compound without melting to form a single-phase structure, but they have poor wettability to the lands of a printed circuit board or electrodes of electronic parts and have not been used.

A solder paste according to the present invention is provided by mixing flux with a powder mixture of Sn powder or an Sn based lead-free solder powder with Cu or Ag powder which has Ni plating formed on its surface. Although the solder paste performs bonding by means of an intermetallic compound without melting to form a single phase structure, the Ni plating acts as a barrier which retards the formation of the intermetallic compound so as to leave enough time to permit wetting of the lands of a printed circuit board or electrodes of an electronic part.

9 Claims, 2 Drawing Sheets

SOLDER PASTE

TECHNICAL FIELD

This invention relates to a solder paste which is formed by mixing a solder powder and a soldering flux and which can obtain a solder alloy for use in connection of electronic equipment. The solder alloy has excellent heat resistance and can exhibit high reliability in a high-temperature state.

BACKGROUND ART

In electronic equipment, electronic parts are disposed atop a circuit of printed circuit board or the like to perform prescribed functions. From long in the past, connection of electronic parts to printed circuit boards or other circuits has been performed using solder, which can perform connection at a low temperature, is inexpensive, and has high bonding reliability. Electronic parts used in electronic equipment need to have terminals such as part leads which are connected to printed circuit boards. Solder is also used inside electronic parts to connect terminals such as part leads to part components which perform the basic functions of the electronic parts.

Solder alloys of Sn and Pb particularly having a composition in the vicinity of 60% Sn which have a low melting point have been used as solder alloys in soldering for electronic equipment. In particular, a 63Sn-37Pb composition has a solidus temperature and a liquidus temperature which are both 183° C., thereby minimizing the formation of cracks at the time of cooling of solder. In addition, as it has the lowest melting temperature among solder alloys of Sn and Pb, it also minimizes damage to electronic parts due to heat. It is so widely used that the term "solder" generally refers to a 63Sn-37Pb solder alloy.

However, if a 63Sn-37Pb solder alloy is used to perform internal bonding of an electronic part, due to the heat which is applied during manufacture of electronic equipment, solder inside an electronic part may melt, thereby causing short circuits or disconnection of part components and leads which are connected by solder, and the electronic part can no longer function properly. Therefore, solders with a higher melting point than a 63Sn-37Pb solder alloy is used for bonding inside electronic parts. These solder alloys are referred to as high-temperature solders in view of their melting points which are high compared to solders such as 63Sn-37Pb used in soldering printed circuit boards High-temperature solders for use in internal bonding of electronic parts primarily have Pb as a main component and include Pb-10Sn (solidus temperature of 268° C. and liquidus temperature of 302° C.), Pb-5Sn (solidus temperature of 307° C. and liquidus temperature of 313° C.), Pb-2Ag-8Sn (solidus temperature of 275° C. and liquidus temperature of 346° C.), Pb-5Ag (solidus temperature of 304° C. and liquidus temperature of 365° C.), and the like. Since these high-temperature solders have a solidus temperature of at least 260° C., even if the soldering temperature of a 63Sn-37Pb eutectic solder used for soldering of printed circuit boards is a somewhat high value of 230° C., the soldered portions inside electronic parts soldered with a high-temperature solder such as Pb-10Sn do not melt at the time of soldering of printed circuit boards.

Because portions to be connected inside electronic parts are minute, soldering for the purpose of bonding inside electronic parts is carried out by reflow soldering, which is capable of performing fine soldering. Methods of applying solder paste to portions to be soldered include printing, discharging of solder paste using a dispenser, transfer of solder paste by transfer pins, and the like. Solder paste used in reflow soldering is formed by mixing solder powder and a soldering flux. As electronic parts become smaller, the solder powder used in solder paste is becoming finer. Because the surface of such fine solder powder is susceptible to oxidation, solder powder having a clean powder surface is desired.

When soldered electronic equipment breaks or becomes old and difficult to use, it may be discarded instead of being repaired or being used with patience. When electronic equipment is discarded, plastic, glass, metal, and the like which constitute the electronic equipment is sometimes recovered and reused, but since printed circuit boards have copper foil bonded to resin portions and having solder deposited thereon, it is difficult to separate these materials for recovery and reuse, and the circuit boards have been buried after pulverization or as is.

Due to extensive use of fossil fuels in recent years, rain which falls onto the ground is becoming acidic. If acid rain permeates into the ground and contacts printed circuit boards which have been disposed of by burial, the Pb in solder is dissolved out, and acid rain containing Pb further permeates into the ground and is incorporated into underground water. If underground water containing the Pb is drunk by humans for long periods of time, the Pb accumulates in the body and it is said to eventually cause lead poisoning. Therefore, the use of Pb has come to be regulated on a global scale. Naturally, Pb—Sn high-temperature solders and Pb—Sn eutectic solder which have conventionally been used for soldering are also becoming objects of regulation.

In light of the fact that the use of Pb—Sn solder is becoming regulated, the use of lead-free solder which does not contain any Pb is now recommended. Lead-free solder is formed by a combination of two or more elements such as Sn, Ag, Sb, Cu, Zn, Bi, In, Ni, Cr, Fe, P, Ge, and Ga. Examples of binary lead-free solders are Sn-3.5Ag (eutectic temperature of 221° C.), Sn-55b (eutectic temperature of 240° C.), Sn-0.75Cu (eutectic temperature of 227° C.), Sn-58Bi (eutectic temperature of 139° C.), and Sn-52In (eutectic temperature of 117° C.). There are also ternary or higher order systems which combine the above elements to improve the melting point or mechanical properties. At present, lead-free solders which are frequently used include Sn-3Ag-0.5Cu (solidus temperature of 217° C. and liquidus temperature of 220° C.), Sn-8Zn-3Bi (solidus temperature of 190° C. and liquidus of 197° C.), Sn-2.5Ag-0.5Cu-1Bi (solidus temperature of 214° C. and liquidus temperature of 221° C.), and the like. These lead-free solders have a melting temperature which is approximately 40° C. higher than that of a conventional 63Sn-37Pb solder alloy.

However, even if one desired to use a high-temperature lead-free solder for initial soldering due to regulations on the use of Pb, there was no high-temperature solder having Sn as a primary component and having a solidus temperature of at least 260° C. For example, in the case of an Sn—Ag based solder having a solidus temperature (eutectic temperature) of 221° C. or an Sn—Sb based solder having a solidus temperature of 227° C., if the Ag content is increased, the liquidus temperature increases but the solidus temperature does not. In the case of an Sn—Sb based solder, an extreme increase in the content of Sb causes the liquidus temperature to also greatly increase. Addition of other elements to the alloy also causes the solidus temperature to increase, and this behavior cannot be changed. Therefore, it has been thought impossible to use a lead-free solder as a high-temperature solder for internal bonding of electronic parts.

High-temperature solders in which Sn and In are added to Zn, Al, and Ge, and high-temperature solders in which Sn and In are added to Zn, Al, Ge, and Mg have been disclosed as high-temperature solders for internal bonding of electronic parts.

Because these high-temperature solders contain elements such as Zn, Al, and Mg which have poor wettability, the solders are not suitable for use with electronic parts. These conventional high-temperature solders melt to form a single-phase structure. In contrast, JP 2002-254194 A discloses a high-temperature solder which performs bonding by forming an intermetallic compound without forming a single-phase structure by melting.

Patent Document 1: JP 2002-254194 A

DISCLOSURE OF INVENTION

High-temperature solders having a higher melting temperature than solder alloys used for soldering of printed circuit boards have been used for internal bonding of electronic parts. The use of Pb is being regulated on a global scale, but a practicable high-temperature solder which does not contain Pb has not been developed.

High-temperature solders in which Sn and In are added to Zn, Al, or Ge or to Zn, Al, Ge, and Mg are known for use in bonding inside electronic parts. However, if these solder alloys are formed into solder powder for use in a solder paste, due to the susceptibility to oxidation of Zn and Al which are the main components of the powder, a thick oxide film is formed on the surface of the powder, thereby causing the powder to have an extremely poor wettability. When such powder is mixed with a flux to form a solder paste, the resulting paste is not at all capable of actual use, since non-wetting occurs when it is used for soldering of electronic parts.

Patent Document 1 discloses a high-temperature solder which carries out bonding by means of an intermetallic compound without melting to form a single-phase structure and which is characterized by comprising Sn balls and Cu balls. Instead of completely melting to form a single-phase structure as in typical soldering, only Sn (which has a lower melting temperature) melts and forms a $Cu_6Sn_5$ intermetallic compound with Cu, and the Sn balls and Cu balls function to bond by the intermetallic compound which has a high melting temperature. Namely, in that soldering method, only the Sn balls melt, while the Cu balls do not melt and remain in the state of dispersion.

However, if this high-temperature solder is used at a temperature of not higher than approximately 300° C., which is the guaranteed heat resisting temperature of a chip part, since this temperature is high compared to 1083° C. which is the melting temperature of Cu balls, the solder itself has poor wettability, and reliable bonding cannot take place, thereby causing the formation of only weak joints. This is because with this high-temperature solder, bonding of the lands of a printed circuit board and terminals of electronic parts takes place by melting Sn, which is the component of the lower melting point balls, and spreading of the molten Sn on the lands of the printed circuit board or the terminals of the electronic part. If the Sn balls and Cu balls begin to react to form an intermetallic compound, all of the molten Sn is replaced by the intermetallic compound, so no further wetting and spreading of the molten Sn on the lands of a printed circuit board or the terminals of an electronic part takes place. In Patent Document 1, Sn and Cu react to form an intermetallic compound which grows before Sn adequately wets the lands or electronic parts. Therefore, although a reaction between the Sn balls and the Cu balls to form an intermetallic compound occurs adequately, there is not enough time for molten Sn to wet the lands of a printed circuit board or the terminals of electronic part, resulting in insufficient spreading and inadequate joint strength.

The high-temperature solder disclosed in Patent Document 1 has another problem in that it exhibits no self-alignment effect at all. The self-alignment effect refers to an effect which takes place in reflow soldering or the like in which even when a chip part is mounted in a deviated position due to poor accuracy of a mounter, the part returns to the correct position at the time of reflow and is soldered in the correct position. Thus, even if a part is mounted in a deviated position, the chip part is pulled by surface tension and returns to its original position when the solder melts and wets lands or electronic parts. Such an effect is not exhibited by an electrically conductive adhesive, which is one reason why solder is widely used for bonding of electronic parts.

The object of the present invention is to provide a solder paste using a high-temperature solder which performs bonding by means of an intermetallic compound, which is a form of bonding which has been theoretically established but has not actually been utilized, the solder paste making it possible to perform strong solder bonding without the occurrence of non-wetting even when used at a temperature of not higher than approximately 300° C. which is the heat resisting temperature of chip parts.

The present inventors found that in a high-temperature solder which performs bonding by means of an intermetallic compound using Sn balls and Cu balls without melting to form a single-phase structure, if the surface of the Cu balls (or Cu powder) has a coating of a metal which impedes diffusion of Cu into molten Sn, the formation of an intermetallic compound of Sn and Cu is retarded, and it is ensured that Sn has enough time to adequately wet the lands of a printed circuit board or the terminals of an electronic part, thereby making it possible to improve the wettability to the lands of a printed circuit board or the terminals of an electronic part. They thereby completed the present invention.

The metal coating on the surface of Cu powder for impeding diffusion into Sn according to the present invention may be formed from a metal which can dissolve in Sn to form a solid solution, which has a melting point equal to or higher than that of Sn, and which does not interfere with solderability of Sn when it is dissolved in Sn to form a solid solution. Examples of such a metal are Sn, Sb, Au, Ag, Cu, Pt, Pd, Fe, Ni, Co, and the like. These metals exhibit a barrier effect by forming a coating on the surface of Cu powder. In contrast to a coating of these metals, a coating of an organic material such as rosin or a flux melts at the time of heating and does not exhibit a barrier effect. Among these metals, Ni satisfies the conditions that its melting point is higher than Sn, that its dissolution rate into Sn is slow, and that it gives good solderability when it is dissolved in Sn to form a solid solution. Ni has a melting point of 1453° C., and although it forms a solid solution in Sn, its dissolution rate in Sn is slow. In addition, it has excellent solderability and hence has been used from in the past as a substrate for Au plating. Furthermore, Ni provides the effect that it increases solderability when it is dissolved in Sn in solder. In a high-temperature solder paste according to the present invention using Sn powder and Cu powder, by forming an Ni coating on the Cu powder, the Ni gradually dissolves in Sn as Sn melts by heating for soldering, and after a length of time has passed, the dissolution of the Ni coating in Sn proceeds until the coating tears, thereby allowing Sn and Cu to contact each other and form a $Cu_6Sn_5$ intermetallic compound.

Thus, according to the present invention, the formation of an intermetallic is compound of Sn and Cu is retarded by forming a barrier layer of an Ni coating on the surface of Cu powder so as to ensure enough time for Sn to adequately wet the lands of a printed circuit board and the terminals of an electronic part, whereby it becomes possible to improve the wettability to the lands of a printed circuit board or the terminals of an electronic part.

A coating of Ni used in the present invention is preferably formed by plating. Ni plating may be electroplating or electroless plating. Electroless plating is suitable as a method of plating minute powder, but a Ni coating formed by electroless plating contains P, so it is necessary to be careful about the effects of P. P increases wettability at the time of soldering, but it forms a hard alloy layer in the solder interface. Therefore, it is necessary that the P content not be excessive. The effect of P in electroless Ni plating can be ignored when the content of P is at most 10 mass %.

The present invention ensures enough time for Sn to adequately wet the lands of a printed circuit board or the terminals of an electronic part by forming a coating of Ni on the surface of Cu powder. If the coating of Ni formed on the surface of Cu powder is too thin, a barrier effect is not exhibited, while if the Ni coating is too thick, the Ni coating remains on the Cu surface after Sn has adequately wet the lands of a printed circuit board or the terminals of an electronic part and interferes with the formation of an intermetallic compound of Sn and Cu. The amount of Ni in the form of Ni plating which is formed on the surface of Cu powder is preferably 0.2-2.0 mass % based on the coated Cu powder as a whole. More preferably, the amount of Ni as Ni plating is 1.0-2.0 mass % of the Cu powder as a whole.

Sn powder or Sn based lead-free solder powder used in the present invention needs to wet the lands of printed circuit boards or the terminals of electronic parts when it melts, and it also needs to melt at a heating temperature at which intermetallic compounds are formed. Sn powder by itself is adequate for this purpose, but a powder formed by mixing Sn with another metal to form an alloy may also be used as long as the alloy melts at a heating temperature for forming an intermetallic compound. A typical lead-free solder alloy is an alloy formed by mixing Sn with a metal which dissolves in molten Sn to form a solid solution. Such an alloy has better wettability with respect to the lands of printed circuit boards or the terminals of electronic parts than does Sn by itself. Conceivable metals which form a solid solution with Sn are Ag, Cu, Sb, Bi, In, Zn, and the like, and examples of an Sn based lead-free solder alloy are Sn—Ag based alloys, Sn—Cu based alloys, Sn—Sb based alloys, Sn—Bi based alloys, Sn—In based alloys, and Sn—Zn based alloys. However, since an Sn based lead-free solder alloy according to the present invention is used as a powder, Sn—In based solder alloys and Sn—Zn based solder alloys which undergo severe oxidation are not suitable.

In the present invention, it is also possible to add a strength-improving element to Sn powder or an Sn based lead-free solder powder as long as the resulting alloy melts at the heating temperature for forming an intermetallic compound. Examples of strength-improving elements which are suitable for the present invention include Ag, Cu, Sb, Bi, Zn, Al, Fe, Co, Ni, and Cr. These elements disperse in a $Cu_6Sn_5$ intermetallic compound formed by heating and increase the strength of soldered joints. However, the amount of strength-improving elements added to increase the strength of soldering is preferably at most 1.0 mass % in total. In particular, Fe, Co, Ni, Cr, and the like readily form an intermetallic compound with Sn, and the strength ends up decreasing if a large amount thereof is added.

The present invention can obtain the same effect using not only Cu powder but also Ag powder as a high-temperature powder which does not melt at the heating temperature. However, Ag more readily forms a solid solution with Sn than does Cu, and it rapidly forms intermetallic compounds after a barrier layer starts to dissolve. Therefore, when using Ag powder as a high-temperature powder, it is necessary for the barrier layer to be thicker compared to when using Cu. In the present invention, the amount of Ni as Ni plating is preferably 0.5-3.0 mass % based on the coated Ag powder as a whole, and most preferably 2.0-3.0 mass %. In the present invention, when Ag powder coated with Ni plating is used to mix with Sn powder, the Sn powder melts when heated and wets the lands of printed circuit boards and the terminals of electronic parts, and the coating of Ni plating on the Ag powder gradually dissolves in the resulting molten Sn and eventually causes the Ag to be exposed, thereby allowing an $Ag_3Sn$ intermetallic compound to form and grow.

When using an Ag powder in the present invention, it is possible to use not only Sn powder but also an Sn based lead-free solder alloy such as Sn—Ag, Sn—Cu, Sn—Sb, Sn—Bi, and the like as a low melting point metal which wets the lands of printed circuit boards or the terminals of electronic parts. These Sn based lead-free solder alloys may also contain one or more strength-improving elements selected from Ag, Cu, Sb, Bi, Zn, Al, Fe, Co, Ni, and Cr in a total amount of at most 1.0 mass %.

The proportions of a low melting point powder in the form of Sn powder or an Sn based lead-free solder powder and a high melting point powder in the form of Ni-plated Cu powder or Ni-plated Au powder in the present invention are preferably 60-80 mass % of Sn powder or an Sn based lead-free solder powder and 20-40 mass % of Ni-plated Cu powder or Ni-plated Ag powder. More preferably, Sn powder or Sn based lead-free solder powder comprises 70 mass %, and Ni-plated Cu powder or Ni-plated Ag powder comprises 30 mass %.

The most preferred coating metal in the present invention is Ni, but above-described Sn, Sb, Au, Ag, Cu, Pt, Pd, Fe, Co, and the like may also be used. A characteristic of the present invention is that in a high-temperature solder which performs bonding by the formation of intermetallic compounds using a low melting point metal powder such as Sn, an Sn based lead-free solder, or In and a high melting point metal powder such as Cu or Ag, a time lag in the formation of intermetallic compounds is produced after the low melting point metal powder begins to melt by providing a barrier layer on the surface of the high melting point metal powder such as Cu or Ag, whereby it becomes easier for the molten low melting point metal such as Sn or In to wet the lands of a printed circuit board or the terminals of electronic parts. Namely, the present invention is a soldering method for carrying out soldering of electronic parts with a high-temperature solder which comprises Sn powder or an Sn based lead-free solder powder and Cu or Ag powder and which performs bonding by the formation of an intermetallic compound wherein the initial formation of an intermetallic compound of Sn and Cu or Sn and Ag is retarded by a plated coating on the surface of Cu or Ag powder, and Sn or an Sn based lead-free solder can adequately wet the materials to be bonded.

In the present invention, Sn or an Sn based lead-free solder remains in a molten state and can contact the lands of a printed circuit board or the terminals of electronic parts until the plated coating on the surface of Cu or Ag powder is consumed by dissolving in the molten Sn to such an extent that it tears to expose the Cu or Ag powder. Therefore, by using the present invention, the length of contact between a solder alloy and the lands of a printed circuit board or the terminals of an electronic part is increased. Accordingly, a rotational moment develops between electronic parts and lands, and the effect (referred to as the self-alignment effect) of correcting positional deviation of electronic parts by solder paste, which was lacking from the invention of Patent Document 1, is produced.

By using the present invention, even when a high-temperature solder of a type in which bonding is performed by the formation of an intermetallic compound, which is established theoretically but has not been practically applied, is used at a temperature of not higher than approximately 300° C. which is the heat resistance temperature of chip parts, it becomes possible to carry out strong solder bonding without developing non-wetting in which the lands of printed circuit boards or the terminals of electronic parts are not wet.

In addition, in the present invention, the period for which a low melting point metal in the form of Sn powder or an Sn based lead-free solder powder remains in a molten state is prolonged, thereby making it possible to achieve the self-alignment effect and correct a certain amount of positional deviation by a mounter.

BEST MODE FOR CARRYING OUT THE INVENTION

Figure 1:
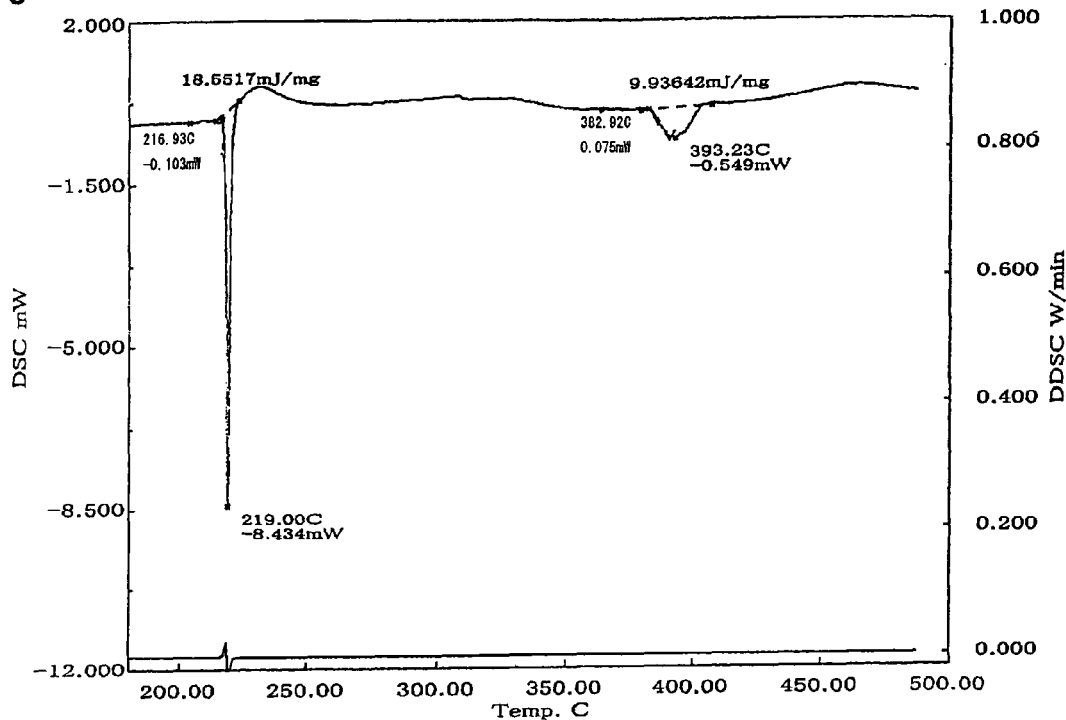
FIG. 1—A DSC chart of a mixed powder consisting of 70 mass % of Sn-3.0 mass % Ag-0.5 mass % Cu powder and 30 mass % of Cu-1.0 mass % Ni powder.

Solder pastes according to the present invention and those of comparative examples were prepared by the following procedure.

Example 1

1. Low melting point alloy powder (particle diameter of powder: 2-15 μm)
   1) Sn powder
   2) Sn-3.5 mass % Ag powder
   3) Sn-0.7 mass % Cu powder
   4) Sn-5 mass % Sb powder
   5) Sn-58 mass % Bi powder
   6) Sn-3.5 mass % Ag-0.5 mass % Cu powder
   7) Sn-58 mass % Bi-0.8 mass % Ag powder
   8) Sn-0.7 mass % Cu-0.3 mass % Sb powder
   9) Sn-5 mass % Sb-0.05 mass % Ni-0.1 mass % Co powder
2. High melting point powder (particle diameter of powder: 2-15 μm; the Ni content is a coating of the powder formed by electroless plating and having a composition of 95 mass % Ni-5 mass % P)
   1) Cu-0.2 mass % Ni powder
   2) Cu-1.0 mass % Ni powder
   3) Cu-1.5 mass % Ni powder
   4) Cu-2.0 mass % Ni powder
   5) Cu-7.0 mass % Ni powder
   6) Cu-3.0 mass % Sn powder
   7) Ag-0.5 mass % Ni powder
   8) Ag-3.0 mass % Ni powder
   9) Ag-7.0 mass % Ni powder
   10) Cu powder
   11) Ag powder
3. Mixed powder The above-described low melting point alloy powders and high melting point powders were mixed as follows.
   Inventive 1: Sn powder+Cu-0.2 mass % Ni powder
   Inventive 2: Sn powder+Cu-2.0 mass % Ni powder
   Inventive 3: Sn-3.5 mass % Ag powder+Cu-0.2 mass % Ni powder
   Inventive 4: Sn-3.5 mass % Ag powder+Cu-1.0 mass % Ni powder
   Inventive 5: Sn-3.5 mass % Ag powder+Cu-1.5 mass % Ni powder
   Inventive 6: Sn-3.5 mass % Ag powder+Cu-2.0 mass % Ni powder
   Inventive 7: Sn-0.7 mass % Cu powder+Cu-1.0 mass % Ni powder
   Inventive 8: Sn-5 mass % Sb powder+Cu-1.0 mass % Ni powder
   Inventive 9: Sn-58 mass % Bi powder+Cu-1.0 mass % Ni powder
   Inventive 10: Sn-3.5 mass % Ag-0.5 mass % Cu powder+Cu-4.0 mass % Ni powder
   Inventive 11: Sn-58 mass % Bi-0.8 mass % Ag powder+Cu-1.0 mass % Ni powder
   Inventive 12: Sn-0.7 mass % Cu-0.3 mass % Sb powder+Cu-1.0 mass % Ni powder
   Inventive 13: Sn-5 mass % Sb-0.05 mass % Ni-0.1 mass % Co powder+Cu-4.0 mass % Ni powder
   Inventive 14: Sn powder+Ag-0.5 mass % Ni powder
   Inventive 14: Sn powder+Ag-3.0 mass % Ni powder
   Comparative 1: Sn powder+Cu powder
   Comparative 2: Sn powder+Cu-7.0 mass % Ni powder
   Comparative 3: Sn-3.5 mass % Ag powder+Cu powder
   Comparative 4: Sn-3.5 mass % Ag powder+Cu-7.0 mass % Ni powder
   Comparative 5: Sn powder+Ag powder
   Comparative 6: Sn powder+Ag-7.0 mass % Ni powder
4. Flux
   Polymerized rosin—53 mass %
   Hardened castor oil—5 mass %
   Diphenylguanidine HBr—0.4 mass %
   Sebacic acid—2 mass %
   Diethylene glycol monohexyl ether—39.6 mass %
4. Preparation of Solder Paste
   1. 1260 grams of the low melting point alloy powder and 540 grams of the high melting point powder which were selected were charged into a mixer and mixed for 5 minutes.
   2. 200 grams of the flux were added to the mixer.
   3. The contents of the mixer was stirred for 20 minutes.
   4. The resulting mixture was removed from the mixer to obtain 2,000 kg of solder paste.

Example 2

The amount of intermetallic compounds formed by each solder paste prepared in Example 1 was evaluated by measuring heat absorption using a DSC.

TABLE 1

|  | | Low m.p. powder | High m.p. powder | 1st solidus temp. (° C.) | 1st peak temp. (° C.) | 2nd solidus temp. (° C.) | 2nd peak temp. | 1st heat absorption (mJ/mg) | 2nd heat absorption (mJ/mg) |
|---|---|---|---|---|---|---|---|---|---|
| Inventive | 1 | Sn | Cu—0.2Ni | 227 | 231 | 386 | 405 | 22.4 | 13.5 |
|  | 2 | Sn | Cu—2.0Ni | 227 | 231 | 385 | 407 | 23.1 | 11.3 |
|  | 3 | Sn—3.5Ag | Cu—0.2Ni | 217 | 219 | 389 | 402 | 20.6 | 14.1 |
|  | 4 | Sn—3.5Ag | Cu—1.0Ni | 217 | 219 | 387 | 415 | 18.5 | 9.2 |
|  | 5 | Sn—3.5Ag | Cu—1.5Ni | 217 | 219 | 408 | 419 | 23.7 | 10 |
|  | 6 | Sn—3.5Ag | Cu—2.0Ni | 217 | 219 | 405 | 416 | 22.1 | 10.2 |
|  | 7 | Sn—0.7Cu | Cu—1.0Ni | 227 | 231 | 379 | 401 | 21.8 | 11.6 |
|  | 8 | Sn—3Ag—0.5Cu | Cu—1.0Ni | 217 | 219 | 395 | 405 | 24.4 | 13.8 |
|  | 9 | Sn—3.5Ag—8In | Cu—1.0Ni | 197 | 208 | 391 | 408 | 19.6 | 13.6 |
|  | 10 | Sn—0.7Cu—0.3Sb | Cu—1.0Ni | 226 | 230 | 386 | 402 | 22.8 | 12.4 |
|  | 11 | Sn | Ag—0.5Ni | 221 | 222 | 358 | 377 | 22.9 | 12.9 |
|  | 12 | Sn | Ag—3.0Ni | 221 | 223 | 352 | 358 | 23.1 | 13.1 |
| Comparative | 1 | Sn | Cu | 232 | 233 | 385 | 395 | 22.6 | 14.2 |
|  | 2 | Sn | Cu—7.0Ni | 232 | 233 | 305 | 308 | 18.2 | 0.4 |
|  | 3 | Sn—3.5Ag | Cu | 217 | 219 | 394 | 408 | 20.6 | 13.7 |
|  | 4 | Sn—3.5Ag | Cu—7.0Ni | 217 | 219 | 305 | 308 | 15.3 | 0.5 |
|  | 5 | Sn | Ag | 221 | 223 | — | — | — | — |
|  | 6 | Sn | Ag—7.0Ni | 231 | 234 | 304 | 309 | 20.3 | 0.5 |

1. Test Method

1. Each of the solder pastes prepared in Example 1 was printed using a squeegee on a 50 mm×50 mm×0.8 mm alumina substrate through a metal mask with a thickness of 0.15 mm and having an opening measuring 30 mm×30 mm.

2. The alumina substrate was heated for 60 minutes atop a solder bath set to 270° C. to obtain a solder piece bonded to the substrate.

3. The resulting solder piece was peeled off the alumina substrate by washing, and it was then subjected to measurement of the first solidus temperature, the first peak temperature, the heat absorption at the first peak temperature, the second solidus temperature, the second peak temperature, and the heat absorption at the second peak temperature using a DSC (differential scanning calorimeter).

4. DSC measurement was carried out using a differential scanning calorimeter made by SII Corporation at a rate of temperature increase of 5° C. per minute.

2. Results of Measurement

The results of DSC measurement for the inventive and comparative solder pastes are shown in Table 1 above in terms of the first solidus temperature, first peak temperature, second solidus temperature, second peak temperature, first heat absorption, and second heat absorption.

Comparing Comparatives 1 and 3-6 with Comparatives 1 and 3 which had corresponding compositions but did not have Ni plating, it can be seen that the first heat absorption and the second heat absorption for Comparatives 1 and 3-6 were small compared to Comparatives 1 and 3, indicating that Sn and Sn—Ag reacted with Cu more smoothly.

In contrast, with Comparatives 2 and 4 which had compositions corresponding to Comparatives 1 and 3-6 but which had a thick Ni plating, hardly any second heat absorption was detected. This indicates that in Comparatives 2 and 4, the reaction of Sn or Sn—Ag with Cu hardly progressed at all.

Figure 2:
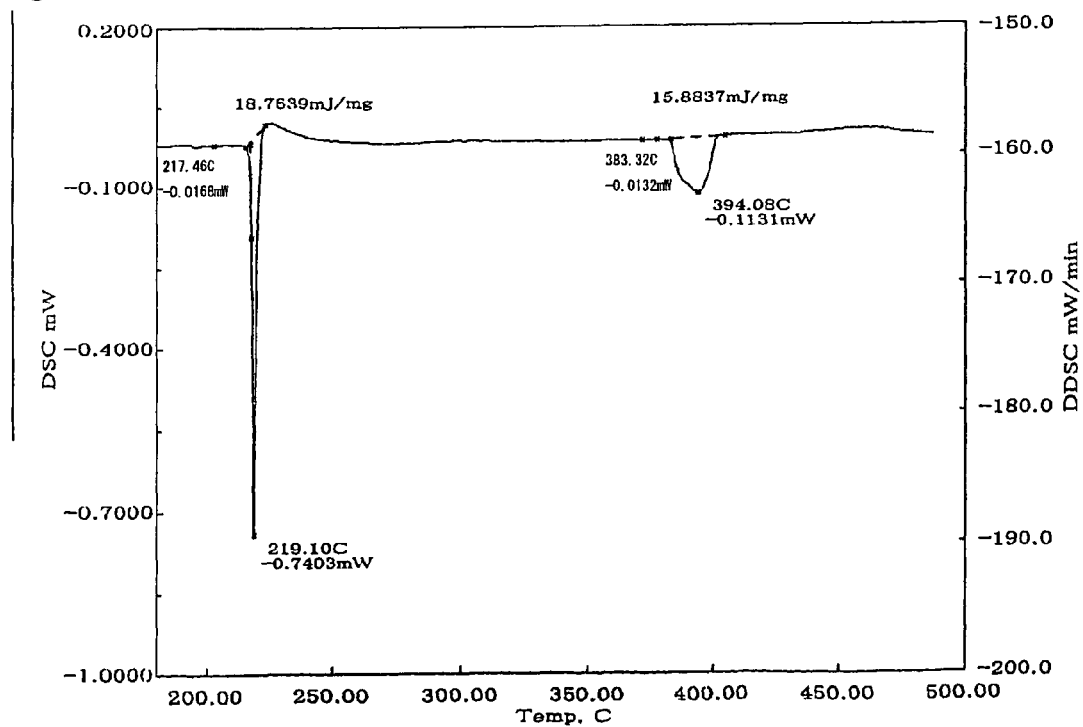
FIG. 2—A DSC chart of a mixed powder consisting of 70 mass % of Sn-3.0 mass % Ag-0.5 mass % Cu powder and 30 mass % of Cu powder.
Figure 3:
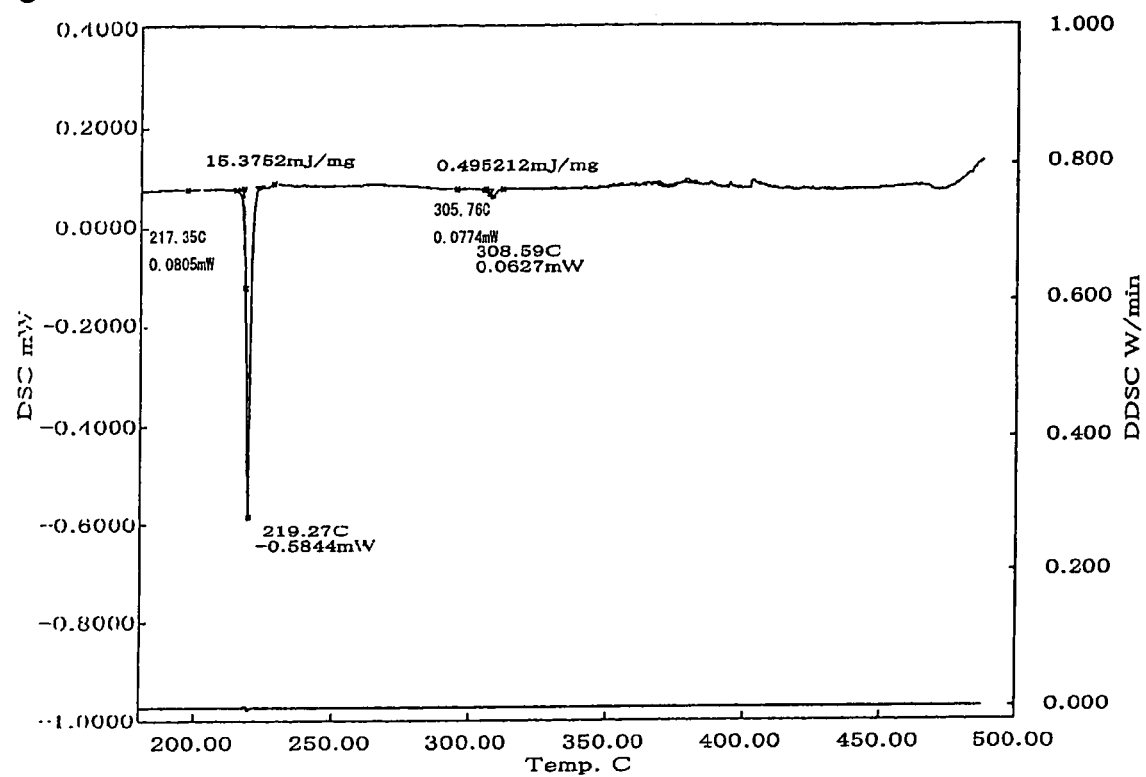
FIG. 3—A DSC chart of a mixed powder consisting of 70 mass % of Sn-3.0 mass % Ag-0.5 mass % Cu powder and 30 mass % of Cu-7.0 mass % Ni powder.

Next, referring to actual DSC charts, FIG. 1 is a DSC chart of a solder paste comprising a mixed powder consisting of 70 mass % of Sn-3 mass % Ag-0.5 mass % Cu powder and 30 mass % of Cu-1.0 mass % Ni powder of Comparative 8, FIG. 2 is a DSC chart of a solder paste comprising a mixed powder consisting of 70 mass % of Sn-3 mass % Ag-0.5 mass % Cu powder and 30 mass % of Cu powder not having Ni plating formed thereon, and FIG. 3 is a DSC chart of a solder paste comprising a mixed powder consisting of 70 mass % of Sn-3 mass % Ag-0.5 mass % Cu powder and 30 mass % of Cu-7.0 mass % Ni powder having a thick Ni plating formed thereon.

Comparing FIGS. 1 and 2, a large peak of second heat absorption appears in FIG. 2, whereas the second heat absorption peak is more gradual in FIG. 1. In FIG. 3, there is hardly any second heat absorption peak. Occurrence of the second heat absorption peak indicates the formation of an intermetallic compound between Sn or Sn—Ag and Cu. Therefore, it can be seen that an intermetallic compound between Sn or Sn—Ag and Cu was abruptly formed in FIG. 2, an intermetallic compound between Sn or Sn—Ag and Cu was not formed in FIG. 3 which both correspond to Comparatives, while an intermetallic compound between Sn or Sn—Ag and Cu was gradually formed in FIG. 1 which corresponds to Comparative 8.

Example 3

The wettability of each solder paste prepared in Example 1 was evaluated from the molten state of a piece of solder at various temperatures with various heating times.

TABLE 2

|  | | Low m.p. powder | High m.p. powder | Wettability |
|---|---|---|---|---|
| Inventive | 1 | Sn | Cu—0.2Ni |  |
|  | 2 | Sn | Cu—2.0Ni |  |
|  | 3 | Sn—3.5Ag | Cu—0.2Ni |  |
|  | 4 | Sn—3.5Ag | Cu—1.0Ni |  |
|  | 5 | Sn—3.5Ag | Cu—1.5Ni |  |
|  | 6 | Sn—3.5Ag | Cu—2.0Ni |  |
|  | 7 | Sn—0.7Cu | Cu—1.0Ni |  |
|  | 8 | Sn—3Ag—0.5Cu | Cu—1.0Ni |  |
|  | 9 | Sn—3.5Ag—8In | Cu—1.0Ni |  |
|  | 10 | Sn—0.7Cu—0.3Sb | Cu—1.0Ni |  |
|  | 11 | Sn | Ag—0.5Ni |  |
|  | 12 | Sn | Ag—3.0Ni |  |

TABLE 2-continued

| | | Low m.p. powder | High m.p. powder | Wettability |
|---|---|---|---|---|
| Comparative | 1 | Sn | Cu |  |
| | 2 | Sn | Cu—7.0Ni |  |
| | 3 | Sn—3.5Ag | Cu |  |
| | 4 | Sn—3.5Ag | Cu—7.0Ni |  |
| | 5 | Sn | Ag |  |
| | 6 | Sn | Ag—7.0Ni |  |

1. Test Method

1. Each of the solder pastes prepared in Example 1 was printed with a squeegee on 50 mm×50 mm×0.8 mm alumina substrates through a metal mask having a thickness of 0.15 mm and having an opening measuring 30 mm×30 mm.

2. The alumina substrate was heated for 30 seconds or 120 seconds atop a solder bath set to 270° C. to obtain a solder piece bonded to the substrate.

2. Test Results

The resulting solder pieces are shown in Table 2.

In Comparatives 2, 4, and 6, the surface of Cu or Ag was coated with Ni in an amount of 7.0 mass %, so an adequate wetting time was ensured. Therefore, the results of the wettability test were comparable to the Comparatives, but these results were classified among the Comparatives in accordance with the compositions thereof.

In summary, those examples in which Cu powder or Ag powder were not coated with Ni had poor wettability, and the solder pieces did not form into spheres, whereas in those examples in which the surface of Cu powder or Ag powder was plated with Ni, the pieces formed into spheres even with 0.2 mass % of Ni. Although there was variation in accordance with the solder composition of the low melting point powder, the solder pieces became spherical when the surface of Cu powder or Ag powder was plated with 1.0 mass % of Ni.

Example 4

The self-alignment effect of each solder paste prepared in Example 1 was is measured.

1. Test Method

1. Each paste was printed with a squeegee on a glass epoxy substrate measuring 100 mm×80 mm×1.0 mm and having lands for 3216-size chips formed thereon using a special metal mask designed to evaluate the self-alignment effect, with the mask positioned at an angle deliberately deviated by 100.

2. 3216-size chip resistors and capacitors were mounted on the lands using a mounter.

3. The glass epoxy substrate was heated for reflow at a peak temperature of 270° C. with a peak time of 30-60 seconds, and it was determined whether the chips returned to the lands.

The evaluation standard was as follows:

O: chips completely returned to the lands;

Δ: chips moved but did not return to the lands;

X: chips did not move.

One hundred of the chip parts on the glass epoxy substrate were selected, and the evaluation of the solder paste was whichever of O, Δ, and X was most numerous among the selected parts.

4. The results of the self-alignment effect are shown in Table 3.

2. Test Results

Example 5

TABLE 3

| | | Low m.p. powder | High m.p. powder | Self-alignment test | Dropping test | Shear strength of electronic part |
|---|---|---|---|---|---|---|
| Inventive | 1 | Sn | Cu—0.2Ni | Δ | ○ | 52 |
| | 2 | Sn | Cu—2.0Ni | ○ | ○ | 56 |
| | 3 | Sn—3.5Ag | Cu—0.2Ni | Δ | ○ | 58 |
| | 4 | Sn—3.5Ag | Cu—1.0Ni | ○ | ○ | 60 |
| | 5 | Sn—3.5Ag | Cu—1.5Ni | ○ | ○ | 64 |
| | 6 | Sn—3.5Ag | Cu—2.0Ni | ○ | ○ | 67 |
| | 7 | Sn—0.7Cu | Cu—1.0Ni | ○ | ○ | 56 |
| | 8 | Sn—3Ag—0.5Cu | Cu—1.0Ni | ○ | ○ | 63 |
| | 9 | Sn—3.5Ag—0.5In | Cu—1.0Ni | ○ | ○ | 61 |
| | 10 | Sn—0.7Cu—0.3Sb | Cu—1.0Ni | ○ | ○ | 60 |
| | 11 | Sn | Ag—0.5Ni | Δ | ○ | 57 |
| | 12 | Sn | Ag—3.0Ni | ○ | ○ | 55 |
| Comparative | 1 | Sn | Cu | X | ○ | 46 |
| | 2 | Sn | Cu—7.0Ni | ○ | X | 50 |
| | 3 | Sn—3.5Ag | Cu | X | ○ | 58 |
| | 4 | Sn—3.5Ag | Cu—7.0Ni | ○ | X | 54 |
| | 5 | Sn | Ag | X | X | 56 |
| | 6 | Sn | Ag—7.0Ni | ○ | X | 53 |

A printed circuit board for electronic equipment was soldered using each of the solder pastes prepared in Example 1, the printed circuit board was then inverted and heated for reflow under usual reflow conditions for a lead-free solder to check whether electronic parts dropped off the printed circuit board. The pull strength of soldering to the printed circuit board was measured.

1. Test Method

1. A 100 mm×80 mm×1.0 mm glass epoxy substrate having lands for a 100-pin QFP formed thereon was printed with each solder paste using a dedicated metal mask.

2. A 100-pin QFP was mounted on the printed solder paste using a mounter, and the glass epoxy substrate was subjected to reflow at a peak temperature of 270° C. with a peak time of 30-60 seconds.

3. After being allowed to cool, the substrate was inverted and again subjected to reflow at a peak temperature of 270° C. with a peak time of 40-80 seconds.

4. After the second reflow operation, it was checked whether the QFP dropped off the substrate.

5. The evaluation standard was as follows:

O: The QFP did not drop.

X: The QFP dropped.

2. Results

The results of evaluation are shown in Table 3. Substrates which were soldered using a solder paste according to the present invention did not experience dropping of parts on the second reflow.

Example 6

The shear strength of solder joints formed by soldering substrates for electronic equipment using solder pastes prepared in Example 1 was measured.

1. Test Method

1. Each solder paste was printed using a dedicated metal mask on a glass epoxy substrate measuring 100 mm×80 mm×1.0 mm and having lands for a 100-pin QFP formed thereon.

2. 3216 pin QFPs were mounted atop the printed solder paste using a mounter, and the glass epoxy substrate was subjected to reflow with a peak temperature of 270° C. and a peak time of 30-60 seconds.

3. After being allowed to cool, 5 chips were selected from approximately the center of the substrate, and their shear strength was measured using a push-pull gauge manufactured by Rhesca Co., Ltd.

2. Results

The results of measurement are shown in Table 3. In typical electronic equipment, a bonding strength of at least 50 N is considered satisfactory. Accordingly, the materials using Cu powder having an Ni coating had no problems compared to other cases and had the same or greater initial bonding strength.

A solder paste according to the present invention having an Ni coating on a high melting point metal powder has good wettability with respect to the lands of a printed circuit board or the electrodes of an electronic part, and it also had a self-alignment effect. In addition, it can perform soldering with a good bonding strength when used for mounting electronic parts. This solder paste does not experience melting of solder when used for step soldering, and it is fully usable as a substitute for high-temperature solders.

INDUSTRIAL APPLICABILITY

A metal layer which coats a high melting point powder used in a solder paste according to the present invention is not limited to just a single layer and may be comprised of multiple layers. For example, Au/Ni plating and Pd/Ni plating and the like are conceivable. Au or Pd plating formed atop Ni plating has good wettability by Sn, so it can improve the dispersion of a high melting point powder such as Cu or Ag into Sn.

The invention claimed is:

1. A lead-free solder paste comprising a flux mixed with a powder mixture, the powder mixture comprising a first powder selected from Sn powder and an Sn based lead-free solder alloy powder, and a second powder which has a particle diameter of 2-15 μm and which is selected from Ni-plated Cu powder having Ni plating forming an outer surface and Ni-plated Ag powder having Ni plating forming an outer surface.

2. A solder paste as claimed in claim 1 wherein the second powder comprises Ni-plated Cu powder having Ni plating forming an outer surface with Ni in the Ni plating being 0.2-2.0 mass % of the overall mass of the Ni-plated Cu powder.

3. A solder paste as claimed in claim 1 wherein the second powder comprises Ni-plated Ag powder having Ni plating forming an outer surface with Ni in the Ni plating being 0.5-3.0 mass % of the overall mass of the Ni-plated Ag powder.

4. A solder paste as claimed in claim 1 wherein the first powder is selected from an Sn—Ag based solder alloy powder, an Sn—Cu based solder alloy powder, an Sn—Sb based solder alloy powder, and an Sn—Bi based solder alloy powder.

5. A solder paste as claimed in claim 4 wherein the first powder comprises a powder of a ternary or higher order lead-free solder alloy containing at least one of Ag, Cu, Sb, Bi, Zn, Al, Fe, Co, Ni, and Cr in a total amount of 1.0 mass % as a strength-improving element.

6. A solder paste as claimed in claim 1 wherein the powder mixture comprises 60-80 mass % of the first powder and 20-40 mass % of the second powder.

7. A soldering method comprising applying a solder paste as set forth in claim 1 to an object to be soldered, and heating the solder paste to form an intermetallic compound between Sn in the first powder and one of Cu and Ag in the second powder without forming a single-phase structure of the first and second powders.

8. A soldering method as claimed in claim 7 including forming a $Cu_6Sn_5$ intermetallic compound.

9. A soldering method as claimed in claim 7 including forming a $Ag_3Sn$ intermetallic compound.

* * * * *